(12) United States Patent
Trayling et al.

(10) Patent No.: US 10,305,432 B1
(45) Date of Patent: May 28, 2019

(54) BALANCED RF AMPLIFIER USING A COMMON MODE CHOKE

(71) Applicant: Zinwave, Ltd., Cambridge (GB)

(72) Inventors: Ken Trayling, London (GB); Chris Potter, Cambridge (GB)

(73) Assignee: Zinwave, Ltd., Cambridge (GB)

( * ) Notice: Subject to any disclaimer, the term of this patent is extended or adjusted under 35 U.S.C. 154(b) by 0 days.

(21) Appl. No.: 15/916,897

(22) Filed: Mar. 9, 2018

(51) Int. Cl.
  *H03F 1/26* (2006.01)
  *H03F 3/26* (2006.01)
  *H03F 3/195* (2006.01)
  *H03F 1/02* (2006.01)

(52) U.S. Cl.
  CPC .............. *H03F 1/26* (2013.01); *H03F 1/0205* (2013.01); *H03F 3/195* (2013.01); *H03F 3/26* (2013.01); *H03F 2200/06* (2013.01); *H03F 2200/09* (2013.01); *H03F 2200/165* (2013.01); *H03F 2200/216* (2013.01); *H03F 2200/387* (2013.01); *H03F 2200/451* (2013.01)

(58) Field of Classification Search
  CPC .. H03H 7/42; H03H 11/32; H03F 1/26; H03F 3/26

USPC ....... 455/550.1, 194.2, 253.2, 284, 305, 326
See application file for complete search history.

(56) References Cited

U.S. PATENT DOCUMENTS

| | | | |
|---|---|---|---|
| 4,156,854 A * | 5/1979 | Weller | H03F 3/45085 327/509 |
| 2005/0083133 A1* | 4/2005 | Amano | H03F 1/565 330/301 |
| 2007/0063786 A1* | 3/2007 | Shih | H03H 7/42 333/25 |
| 2007/0115053 A1* | 5/2007 | Vaisanen | H03F 1/0205 330/124 R |
| 2012/0319916 A1 | 12/2012 | Gears et al. | |

* cited by examiner

*Primary Examiner* — John J Lee
(74) *Attorney, Agent, or Firm* — Maynard Cooper & Gale, P.C.; Brian T. Sattizahn

(57) ABSTRACT

A balanced amplifier can utilize a common mode choke to suppress even harmonics in the signals of the balanced amplifier. The common choke can be coupled between cascaded balanced amplifier pairs to receive the differential output signals from one of the balanced amplifier pairs and to provide conditioned signals to the other of the balanced amplifier pairs. The common mode choke can improve the amplitude and phase balance between the differential output signals by providing increased impedance to the passage of common mode signals such as even harmonics.

25 Claims, 11 Drawing Sheets

Series Mode

Shunt Mode

BALANCED RF AMPLIFIER USING A COMMON MODE CHOKE

BACKGROUND

The present application describes the addition of a common mode (CM) choke to a balanced amplifier that reinforces the balanced differential mode signal while rejecting the common mode signals, such as even order harmonics.

Balanced amplifiers, such as balanced push pull amplifiers, can be used to provide suppression of second and other even order harmonics. A balanced amplifier with low levels of imbalance (i.e., phase and amplitude imbalance between the in-phase and anti-phase sides of the amplifier) exhibits reduced even harmonics. The suppression of the even harmonics can be reduced if the amplifier imbalances increase. Cascading extra amplifier stages can increase amplitude and phase imbalance, as can component variations caused by high volume manufacturing.

Manufacturers try to achieve high levels of amplitude and phase balance in balanced amplifiers by using components that are inherently well balanced (i.e., components with very low levels of amplitude and phase imbalance), using select test or tuning methods to improve amplitude and phase balance or using a tightly controlled symmetrical layout of the printed circuit board (PCB) and other components. A common solution is to introduce two balancing/unbalancing transformers (baluns) between each cascaded amplifier stage of the balanced amplifier to limit the imbalances and reduce the even harmonics. However, the addition of extra baluns has the disadvantage of resulting in the loss of gain, reduced power efficiency and increased cost.

SUMMARY

The present application replaces baluns with common mode (CM) chokes, which improve the amplifier balance and reduce the even harmonics, while being less expensive and more power efficient than baluns.

In one aspect of the present application, CM chokes can be used to reduce second order harmonic spur levels on a wideband balanced RF amplifier. The reduction in spur levels results in an increased OIP2 (Output-referred Second Order Intercept Point), a commonly used figure of merit for RF power amplifiers. Other unwanted even harmonics can also be attenuated. The improved balance and even harmonic reduction of the amplifier results in an increased tolerance to amplitude and phase imbalance variations that are caused by high volume production. The tolerance to amplitude and phase imbalance variations allows more amplifier stages to be cascaded without the need for baluns between each cascaded amplifier stage, resulting in reduced cost, less power loss and increased gain.

In another aspect of the application, the improvement in second-order linearity offers the potential to increase the overall power efficiency of the amplifier through the use of more power efficient bias schemes. In yet another aspect of the application, the CM choke can be used to couple a DC bias to the RF transistors of the amplifiers (see FIG. 7). Another aspect of the present application is improved manufacturing yield because PCB layout precision and symmetry requirements can be more relaxed and increased phase and amplitude imbalances introduced by component variations in high volume manufacturing can be tolerated.

The present application can be used in a wideband RF (radio frequency) system having a wideband DAS (distributed antenna system) that has to meet regulatory requirements for spurious emissions. In a wideband RF system in which the bandwidth is more than one octave, second harmonic distortion products can appear in-band where they cannot be improved by filtering. It is then necessary to reduce second-order harmonic levels without the use of filters. One aspect of this application increases the suppression of in-signal even harmonics, of which the second-order harmonic presents the largest problem because the second order harmonic may appear in-band and therefore cannot be suppressed by filters. A further aspect of the application is useful in reducing the amount of filtering required of even harmonic signals that are located outside the passband.

The present application can be used to improve the rejection of even harmonics on any RF or microwave frequency balanced amplifier and thereby improve the OIP2 (Output-referred Second Order Intercept Point—a key figure of merit for RF amplifiers) or reduce the attenuation required from even harmonic filters.

Other features and advantages of the present application will be apparent from the following more detailed description of the identified embodiments, taken in conjunction with the accompanying drawings, which show, by way of example, the principles of the application.

BRIEF DESCRIPTION OF THE DRAWINGS

Wherever possible, the same reference numbers are used throughout the drawings to refer to the same or like parts.

DETAILED DESCRIPTION

Figure 1:
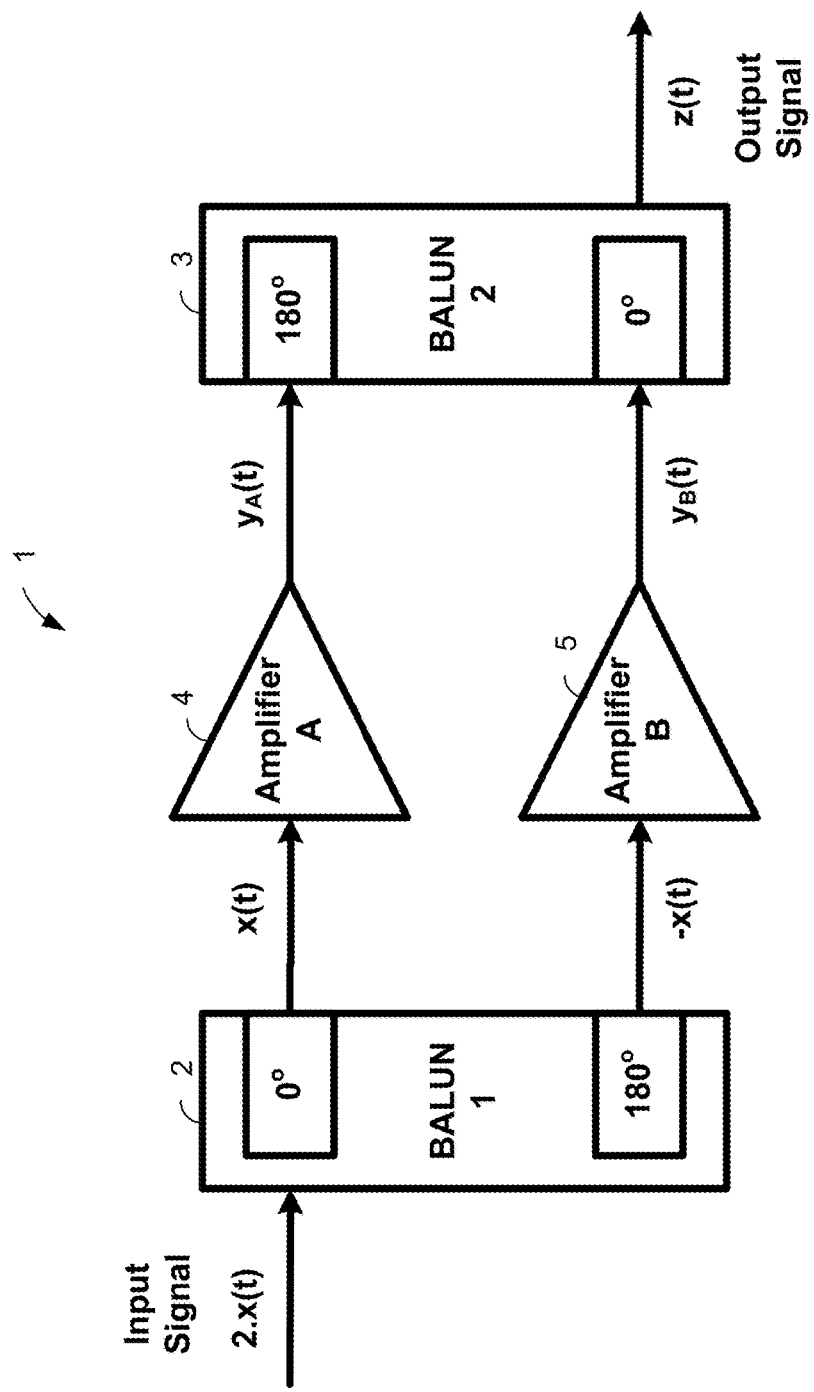
FIG. 1 depicts a block diagram of an embodiment of a balanced amplifier.

FIG. 1 depicts an embodiment of a balanced amplifier (e.g., a push-pull amplifier (PPA)) that can be used in any system that requires the use of nonlinear signal processing, such as a communication system that requires amplification and harmonics suppression inside and outside the passband. In FIG. 1, the push-pull amplifier 1 includes at least two balanced amplifiers 4, 5 that are matched, to within an acceptable degree, in their parameters to provide cancellation of harmonics. An input balancing/unbalancing transformer (balun) 2 converts an unbalanced input signal, labeled in FIG. 1 as 2.$x(t)$, into a balanced output signal, which is introduced to the inputs of the balanced amplifiers 4, 5 in a phase and amplitude controlled manner. In this particular embodiment, the amplitudes of the two signals introduced to the inputs of the balanced amplifiers 4, 5, labeled in FIG. 1 as x(t) and −x(t), are matched and are out of phase by 180 degrees within design margins. The output signals of the balanced amplifiers 4, 5, labeled in FIG. 1 as $y_A(t)$ and $y_B(t)$, are amplified by an equal gain. The output signals from the amplifiers 4, 5 are then converted by an output balun 3 into output signal z(t) by combining the out-of-phase output signals from the balanced amplifiers 4, 5 by effectively shifting one of the input signals, $y_A(t)$ in this embodiment, by 180 degrees and adding the resulting signals together.

In an embodiment of the balanced push-pull amplifier 1 as depicted in FIG. 1, the PPA 1 may facilitate communications between a number of disparate components and/or networks needed in a communication system including and not limited to network devices, mobile communication devices, primary hubs, secondary hubs, remote units, RF gain stages, and power amplifiers. The amplified and conditioned signal from PPA 1 can be further fed into passive systems and/or components such as an antenna, electrical or optical connections, and in some embodiments, a distributed antenna system (DAS). Referring back to FIG. 1, the input balun 2 takes the input fundamental signal of magnitude 2.$x(t)$ and splits the signal into 2 anti-phase signals (e.g., differential mode signals), due to the relative phases (0° and 180°) that are provided to the outputs of the input balun 2. In an embodiment, the anti-phase (e.g., out-of-phase or phase shifted or having a phase shift of) 180° signals of equal magnitude are fed to the two balanced amplifiers 4, 5 (e.g., essentially identical amplifiers with similar (e.g., essentially identical) amplitude & phase responses). The amplifiers' similar non-linear transfer functions, which may essentially be the same, result in signals at the fundamental and harmonic frequencies. The even harmonics of the balanced amplifiers 4, 5 may be in-phase due to the square term of the amplifiers' non-linear transfer function. The output spectrum of each of the balanced amplifiers 4, 5 includes fundamental (tone) and harmonic products illustrated by one representation of the Volterra series as shown in equation (1):

$$y(t)=a_1x(t)+a_2x(t)^2+a_3x(t)^3+a_4x(t)^4 \quad (1)$$

As depicted in FIG. 1, 2.$x(t)$ is the input signal to the PPA 1 and z(t) the corresponding output signal. The input balun 2 produces two anti-phase outputs such that the input signal to amplifier 4 is x(t) and the input signal to amplifier 5 is −x(t).

Because $-x(t)^2 = x(t)^2$, the output $y_A(t)$ of path A and $y_B(t)$ of path B will be according to equations (2) and (3):

$$y_A(t)=a_1x(t)+a_2x(t)^2+a_3x(t)^3+a_4x(t)^4 \quad (2)$$

$$y_B(t)=-a_1x(t)+a_2x(t)^2-a_3x(t)^3+a_4x(t)^4 \quad (3)$$

The output balun 3 combines $y_A(t)$ and $y_B(t)$, which are 180° out of phase, effectively multiplying equation (2) by −1, resulting in equation (4) as the output signal:

$$z(t)=-y_A(t)+y_B(t)=-2a_1x(t)-2a_3x(t)^3 \quad (4)$$

As can be seen from equation (4), odd order harmonics add constructively, including the fundamental signal, while even order harmonics cancel each other out. This results in the suppression of the even harmonics, which can fall within a desired frequency range (e.g., a related communication band).

Returning to FIG. 1, in an exemplary embodiment, the baluns 2, 3 may be implemented by a transformer, a ferrite balun, a microstrip balun, a lumped element transformer, and other similar circuit elements alone or in combination. Exemplary amplifiers 4, 5 may be any RF amplifiers that demonstrate nonlinear effects including both low and high power operations, but are not restricted to either or both cases. In an embodiment, there is a requirement of matching between the amplifiers 4, 5 for the cancellation to occur as described above.

In an embodiment such as represented by FIG. 1, the even harmonic rejection (dB) for small imbalances may be calculated as shown in equation (5) based on the amount of AIMB (amplitude imbalance as a linear ratio), as determined from the AIMB (dB) (amplitude imbalance in dB) as shown in equation (6), and the PIMB (phase imbalance in radians) that exists between the in-phase balanced amplifier 4 and anti-phase balanced amplifier 5.

$$\text{even harmonic rejection (dB)}=-10*\text{Log}_{10}[(\text{AIMB})^2+(\text{PIMB})^2] \quad (5)$$

$$\text{where AIMB}=[10^{AIMB\ (dB)/20}-1] \quad (6)$$

Figure 2:
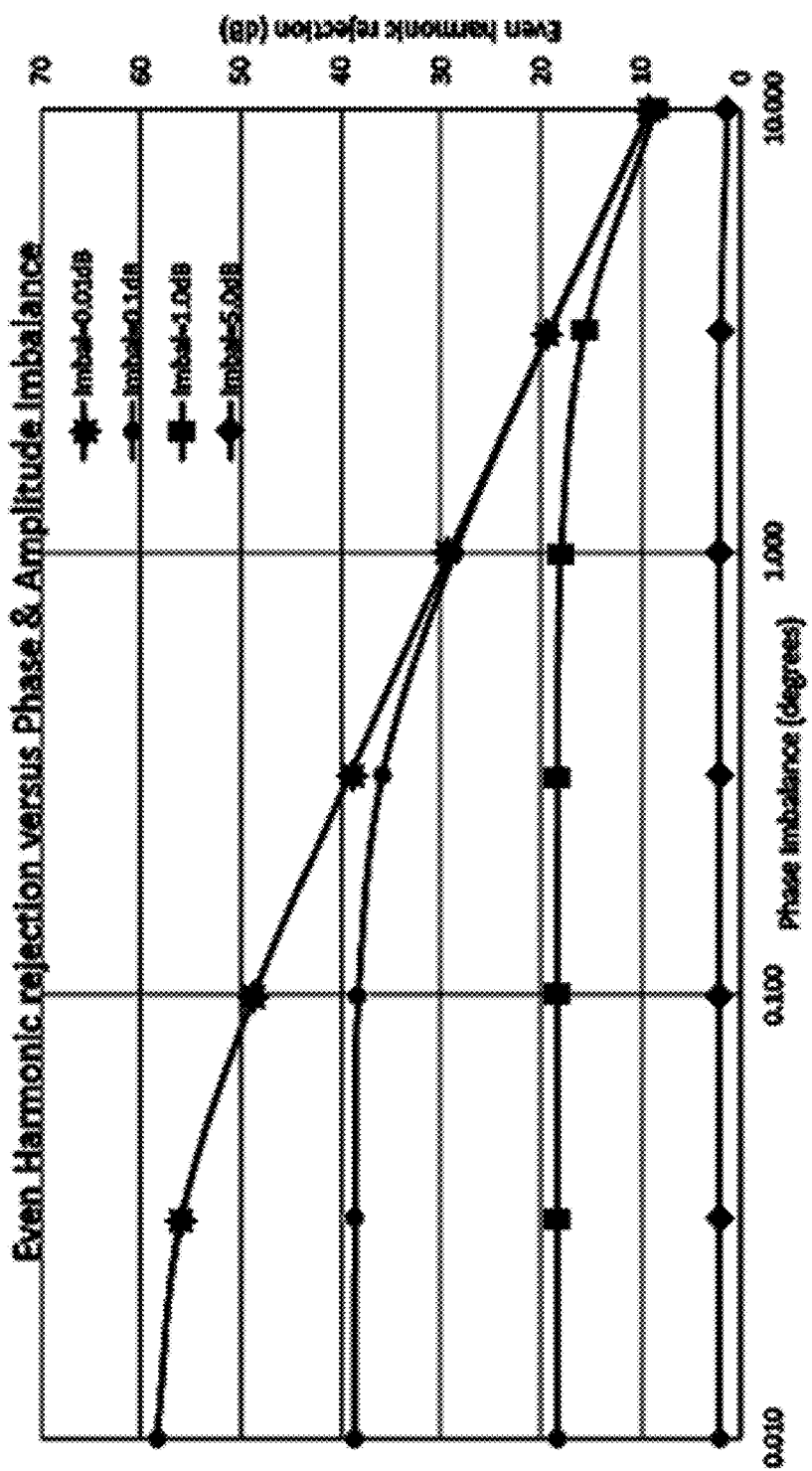
FIG. 2 depicts a graph representing even harmonics rejection vs. phase imbalance for different amplitude imbalances (0.01, 0.1, 1.0, and 5.0 dB).

The level of imbalance determines the amount of harmonic suppression, rejection or reduction. Specifically in this embodiment, low levels of imbalance are desired for even harmonic rejection >20 dB. As shown in FIG. 2, the amount of even harmonic rejection decreases as the phase imbalance increases. Furthermore, different curves in FIG. 2 represent different amounts of amplitude imbalance. It can also be seen from FIG. 2 that the even harmonic rejection decreases as the amplitude imbalance increases given the same amount of phase imbalance.

Figure 3:
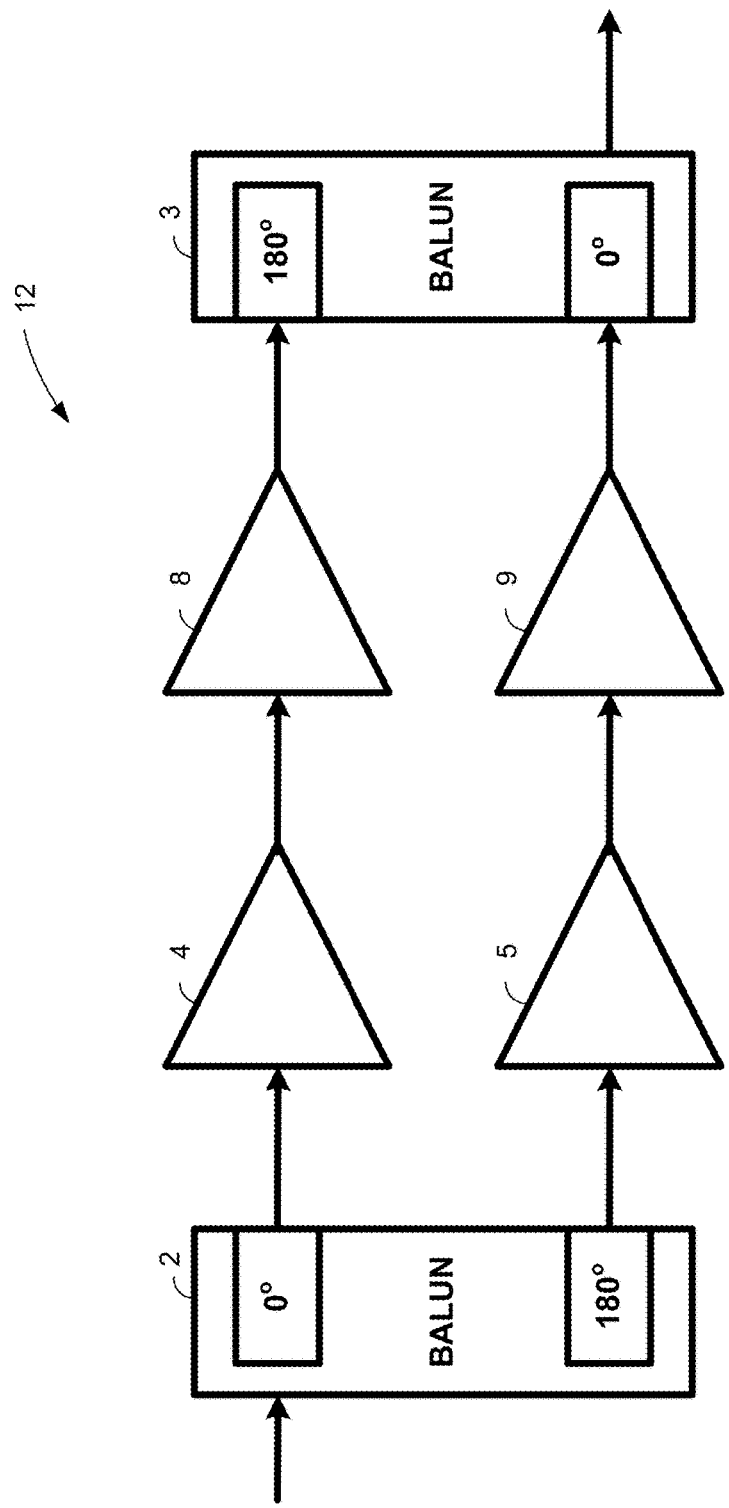
FIG. 3 depicts a block diagram of an embodiment of a balanced amplifier with multiple stages.

In another embodiment, for increased amplifier gain, multiple balanced amplifiers can be arranged in stages and can be cascaded in the implementation of a multiple stage PPA 12 as shown in FIG. 3. The input balun 2 and output balun 3 can remain the same and operate as described before in the case of the single stage PPA 1. Compared to the single stage PPA 1, the only difference in PPA 12 can be the addition of a second stage of balanced amplifiers as shown in FIG. 3. Specifically, in this embodiment, a second amplifier stage with balanced amplifiers 8 and 9 is added in series to the first amplifier stage with balanced amplifiers 4 and 5. Effectively, amplifiers 4 and 8 are combined to form a single cascaded balanced amplifier with amplifiers 5 and 9. The cascaded balanced amplifier can have an overall gain of the multiplication of the gain factors of individual stages. Given the convention of expressing gain in dB, the gain can be the addition of the gains of all applicable cascaded stages minus the applied losses such as connection losses and matching losses. The foregoing is merely illustrative of the principles of a multiple cascaded stages amplifier. Various modifications may be made without departing from the scope of this disclosure such as increasing the number of stages and having amplifier 4 match with amplifier 9 and amplifier 5 match with amplifier 8, etc.

Figure 4:
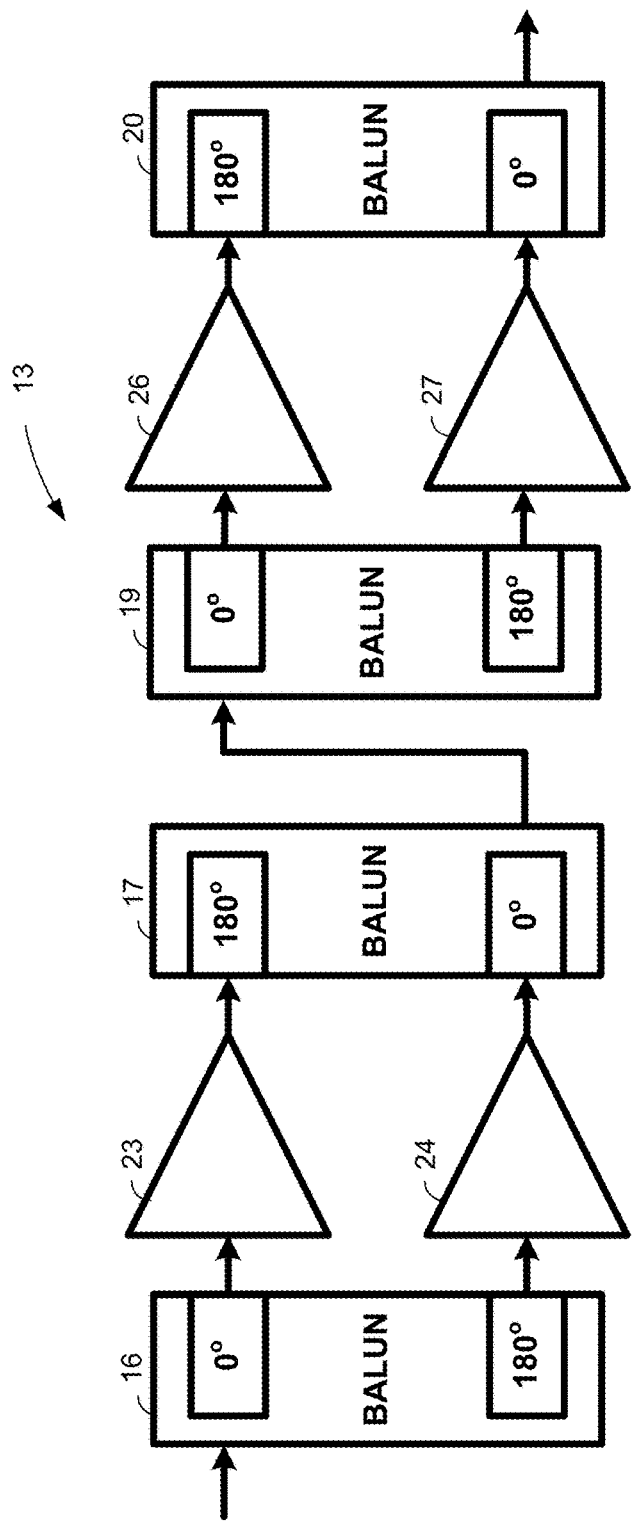
FIG. 4 depicts a block diagram of an embodiment of a multi-stage balanced amplifier with additional baluns for improved balance.

FIG. 4 depicts an embodiment of a multi-stage balanced amplifier 13 with additional baluns for improved balance. In practice, cascading multiple amplifier stages is likely to increase the amplitude and phase imbalance of the balanced amplifier and therefore limit the rejection of even harmonics. The balance and even harmonic rejection in a multi-stage balanced amplifier can be improved by placing two baluns 17, 19 between the two stages of balanced amplifier pairs to limit the amplitude and phase imbalances. In an exemplary embodiment, amplifiers 23 and 24 serve as a pair in one stage before the additional baluns 17, 19, while amplifiers 26 and 27 serve as another pair in a downstream stage after the additional baluns 17, 19. As an exemplary embodiment, FIG. 4 shows the 0° output of the input balun 16 goes to an amplifier 23 with its output connected to the 180° input port of the first additional balun 17. Likewise, the 180° output of the input balun 16 goes to an amplifier 24 with its output connected to the 0° input port of the first additional balun 17. Subsequently, the output of the first additional balun 17 goes to the input of the second additional balun 19. The 0° output of the second additional balun 19 goes to amplifier 26 of the other matched balanced amplifier pair, which amplifier 26 has its output going to the 180° input of the output balun 20. The 180° output of the second additional balun 19 goes to the amplifier 27 of the other matched balanced amplifier pair, which amplifier 27 has its output going to the 0° input of the output balun 20. Under this exemplary embodiment, a module including a balun 16, followed by matched amplifier pair 23, 24, and then followed by another balun 17, can serve the function of harmonic suppression and allow correction of imbalances. Similarly balun 19, matched amplifier pair 26, 27, and balun 20 can form another module. The additional module can, in principle, allow more gain, better imbalance improvements, and thus better harmonics rejections. However, the transformation from balanced to single ended (or unbalanced) and back to balanced (i.e., the transition provided by the additional baluns 17, 19) incurs additional insertion loss that reduces gain and degrades power efficiency, at the same time, increasing component cost and physical size.

Figure 5:
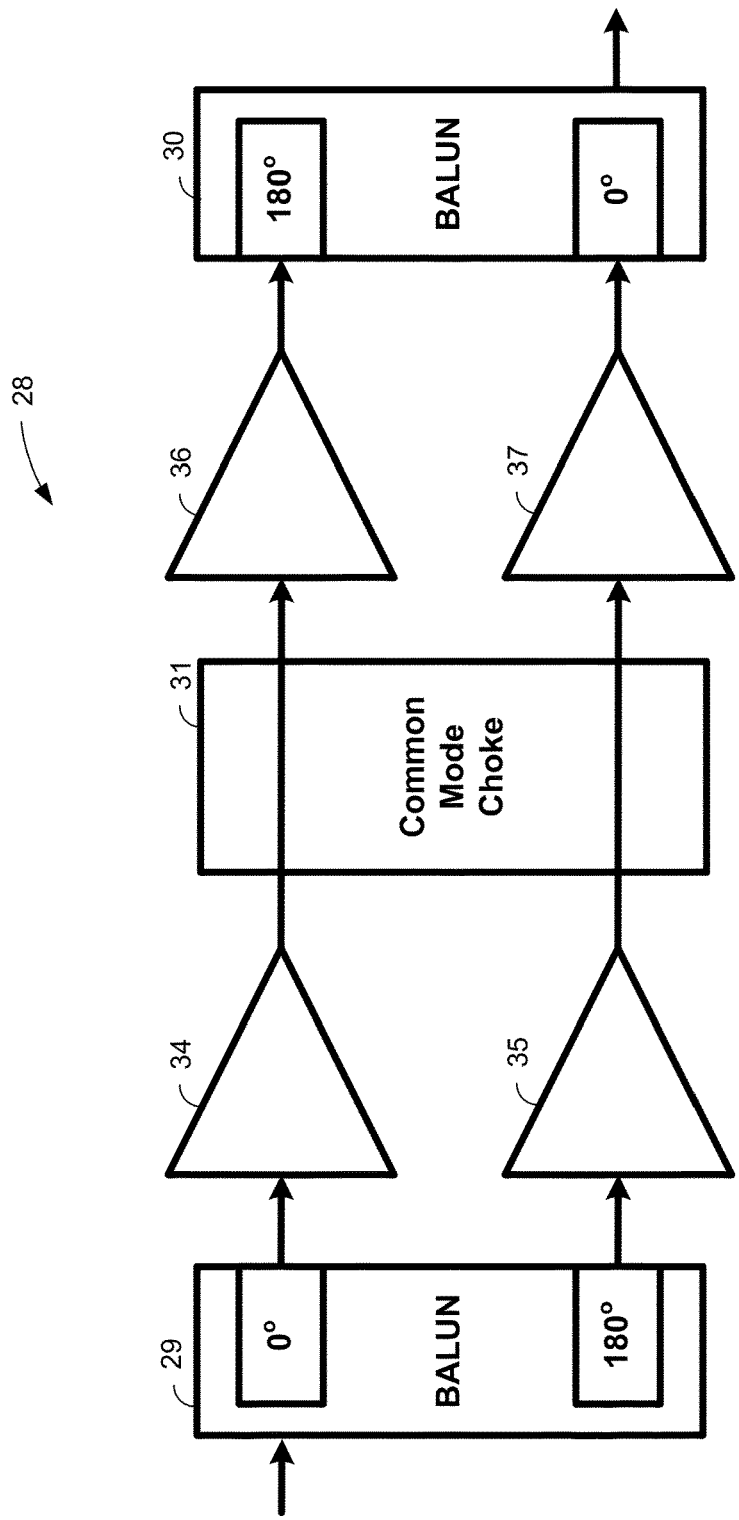
FIG. 5 depicts a block diagram of a multi-stage balanced amplifier with a common mode (CM) choke for improved balance in accordance with certain embodiments of the application.

FIG. 5 depicts an embodiment of a multi-stage balanced amplifier 28 with a common mode (CM) choke 31 for improved balance performance. The common mode (CM) choke 31 can be used in any system that requires the use of linear signal processing such as a communication system that requires amplification and harmonics suppression inside and outside the passband. In this exemplary embodiment, FIG. 5 depicts a balanced push-pull amplifier 28 with two cascaded amplifier stages each having a pair of balanced amplifiers 34, 35 and 36, 37 and a CM choke 31 placed between the cascaded amplifier stages which replaces the two baluns 17, 19 of FIG. 4. Furthermore, there is an input balun 29 and an output balun 30 at the front and back ends of the amplifiers 34, 35, 36, 37. The input balun 29 converts an unbalanced signal into a balanced signal, which is introduced to the inputs of the balanced amplifiers 34, 35 in a phase and amplitude controlled manner. In this particular embodiment, the amplitudes of the two signals have matched amplitude and are out of phase by 180 degrees within design margins. The output signals from the balanced amplifiers 34, 35 can be amplified by an equal gain by design. The output signals from the amplifiers 34, 35 are then conditioned by the CM choke 31 to suppress second order harmonics, allow the fundamental signal to go to the next stage, and improve phase and amplitude imbalances. The conditioned signals after the CM choke 31 are fed into the balanced amplifier pair 36, 37 of the next phase. Signals from the balanced amplifier 36, 37 in the last balanced amplifier stage can be fed into an output balun 30. The out-of-phase signals from the balanced amplifier pair 36, 37 can be combined by the output balun 30, effectively shifting one of the input signals by 180 degrees and adding the resulting signals together to produce the final output signal. Additional stages and CM chokes 31 can be added as required to further increase the gain, suppress the undesired harmonics, or to improve signal-to-noise ratio of the output signal. Furthermore, a CM choke 31 may be inserted between input balun 29 and balanced amplifier pair 34, 35 and/or between balanced amplifier pair 36, 37 and output balun 30.

The balanced nature of the CM choke 31 improves the amplitude and phase balance of the wanted fundamental (differential mode) signal and provides an increased or higher impedance to the passage of CM signals such as the even harmonics as either compared to the impedance seen previously by the CM signals or to the impedance seen by the differential mode signals including the fundamental signal.

The CM choke 31 has at least the following beneficial features over the approach of using additional baluns including: 1) a low differential mode impedance, 2) a high common mode impedance, and 3) differential mode coupling that improves amplitude and phase balance. Furthermore, the benefits of using the CM choke 31 between the cascaded balanced amplifier stages include: 1) improvement in the amplifier balance resulting in even harmonics rejection, 2) removal of the need for two baluns between each cascaded pair of amplifiers resulting in a reduction in cost and circuit size, 3) the CM choke contributes less insertion loss than the additional two baluns it replaces, resulting in increased gain and power efficiency of the balanced amplifier, 4) improving the tolerance to phase and amplitude imbalances of balanced push-pull amplifier(s) used, and 5) improving the Output-referred Second Order Intercept Point (OIP2) of a balanced push-pull amplifier.

Referring to FIG. 5, the CM choke 31 can be used to replace the additional baluns 17, 19 that were added to the multi-stage balanced amplifier 13 of FIG. 4 to accomplish balance improvement and harmonics suppression. The replacement of baluns with a CM choke 31 can be applied to any multi-stage PPA and is not limited to the depicted number of stages (two) in FIG. 5. In addition, the use of a CM choke 31 can also improve the balance of a push-pull amplifier with a single pair of balanced amplifiers by being connected between the balanced amplifier pair and the input and/or output balun. Furthermore, in one embodiment, the CM choke 31 can include two separate, non-electrically connected windings wrapped around a ceramic or metallic core that are inductively coupled such that their corresponding magnetic fields can interact. In another embodiment, the CM choke 31 can be implemented with various available technologies including wired ferrite cores of different configurations including twisted, parallel, and separate wires. The CM choke 31 can further include a lumped element or high dielectric constant microstrip, transmission lines or stubs, or exotic materials such as graphene, nanomaterials, or metamaterials. By means of magnetic coupling, current flowing in one of the windings causes an induced current to flow in the opposite direction in the other winding, such that a single-ended input becomes differential, and a purely differential signal applied to the two windings is not significantly impeded by the CM choke. However, a common-mode (in-phase) signal will experience a significant inductance due to the combined magnetic field of the two windings and be suppressed.

Figure 6A:
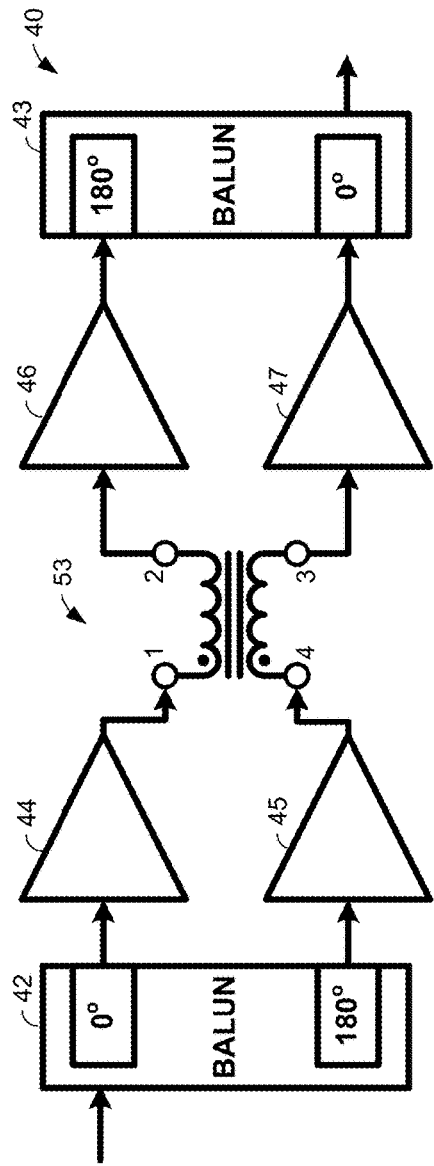
FIGS. 6A and 6B depict block diagrams of balanced amplifiers with a CM choke arranged in either series mode or shunt mode in accordance with certain embodiments of the application.
Figure 6B:
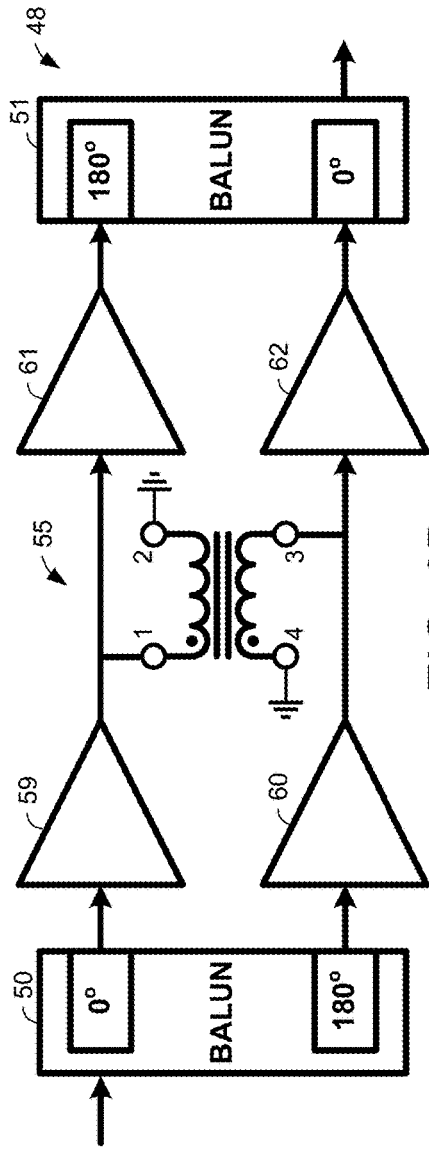

FIGS. 6A and 6B depict two embodiments for implementing a CM choke in multi-stage PPAs 40, 48. FIG. 6A depicts a balanced amplifier 40 with a CM choke 53 arranged in series mode, while FIG. 6B depicts a balanced amplifier 48 with a CM choke 55 arranged in shunt mode. In one embodiment, the CM choke 31 of FIG. 5 can be implemented in a series or shunt mode providing the in-phase dot convention is as shown in FIGS. 6A and 6B.

As shown in FIG. 6A, the CM choke 53, which is connected in series mode, can connect the outputs of balanced amplifier pair 44, 45 to the inputs of the balanced amplifier pair 46, 47. The CM choke 53 can present a high impedance path to the common mode signals, such as the even harmonics (including the second harmonics), due to an additive magnetic field induced by the current flows (following the directions as indicated by the dots on the CM choke 53 and from the phase of the currents) from balanced amplifier pair 44, 45. As a result, the even harmonic signals reaching balanced amplifier pair 46, 47 are suppressed. Meanwhile, the CM choke 53 presents a low impedance path to the differential mode signals, such as the odd harmonics (including the fundamental signal), due to canceling magnetic fields induced by the currents coming from the balanced amplifier pair 44, 45, thus, allowing a low impedance path to balanced amplifier pair 46, 47. As a result, the differential signals are not suppressed. The rest of the operations are the same as in multi-stage balanced amplifier 28 with CM choke 31 as depicted by FIG. 5 and described above. Briefly, the input signal is introduced into the input balun 42, which in turn converts the unbalanced input signal into balanced differential signals. The differential signals are then fed to the balanced amplifier pair 44, 45 and are amplified. The amplified signals are conditioned by the series mode CM choke 53 as described in this paragraph, and the conditioned signals are then fed to the next balanced amplifier stage with balanced amplifier pair 46, 47. The amplified output signals from balanced amplifier pair 46, 47 are then fed into the output balun 43, which combines the out-of-phase signals, effectively shifting one of the input signals by 180 degrees and adding the resulting signals together to produce the final output signal.

As shown in FIG. 6B, the CM choke 55, which is connected in shunt mode, can connect the outputs of the balanced amplifier pair 59, 60 to either ground or the balanced amplifier pair 61, 62. The CM choke 55 can present a low impedance path to the common mode signals, such as the even harmonics (including the second harmonics), due to a canceling magnetic field induced by the current flows (following the directions as indicated by the dots on the CM choke 55 and from the phase of the currents) from balanced amplifier pair 59, 60. As a result, the even harmonics signals are presented with a low impedance path to ground, effectively shorting them to ground and suppressing the even harmonics that reaches the next stage balanced amplifier pair 61, 62. Meanwhile, the CM choke 55 presents a high impedance to the differential mode signals, such as the odd harmonics (including the fundamental signal), due to additive magnetic fields induced by the currents coming from the balanced amplifier pair 59, 60, thus, presenting a high impedance path to ground, effectively blocking its path to ground and forcing the signal to go to the next amplifier stage with balanced amplifier pair 61, 62. Using the CM choke in either series mode or shunt mode has comparable benefits, although circuit losses and the effect of parasitic leakage inductance or inter-winding capacitance of a given CM choke, in a practical implementation, may cause one implementation to be preferable to the other. The rest of the operations are the same as in multi-stage balanced amplifier 28 with CM choke 31 as depicted by FIG. 5 and described above. Briefly, the input signal is introduced into the input balun 50, which in turn converts the unbalanced input signal into a balanced differential signals. The differential signals are then fed to the balanced amplifier pairs 59, 60 and are amplified. The amplified signals are conditioned by the shunt mode CM choke 55 as described in this paragraph, and the conditioned signals are then fed to the next balanced amplifier stage with balanced amplifier pair 61, 62. The amplified output signals from balanced amplifier pair 61, 62 are then fed into the output balun 51, which combines the out-of-phase signals, effectively shifting one of the input signals by 180 degrees and adding the resulting signals together to produce the final output signal.

Figure 7:
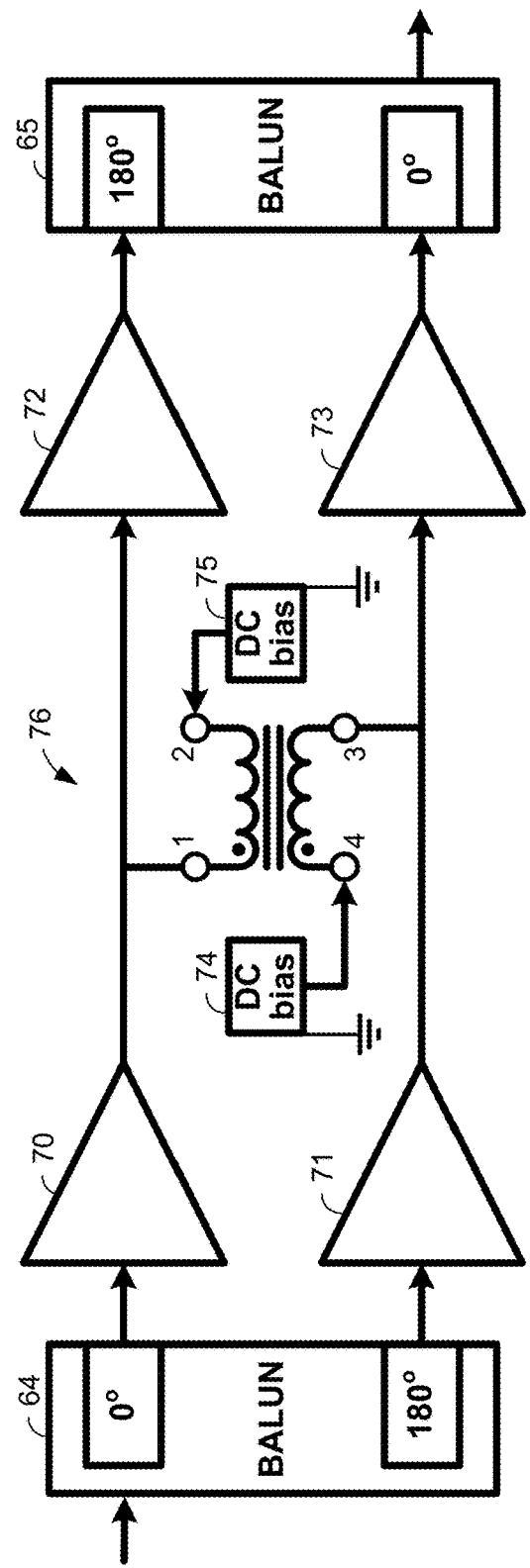
FIG. 7 depicts a block diagram of a balanced amplifier with a CM choke that also provides the amplifiers with bias feed inductance in accordance with certain embodiments of the application.

Referring to FIG. 7, the CM choke 76 (shunt-mode harmonic suppression) can also be used as part of a DC bias feed to the amplifiers as shown in FIG. 7. All amplifier circuits require a DC power feed, which is typically achieved with an RF inductor or an inductive trace on the printed circuit board. The CM choke 76 can provide useful inductance that is required between the DC bias circuit and the RF circuit, thus, providing a saving on component count and RF power loss. The specific inductance required for the DC bias can be readily determined by a person skilled in the art. As before, the CM choke 76 reinforces the balance of the differential mode signals while attenuating common mode signals similar to CM choke 55 shown in FIG. 6B. In an embodiment as shown in FIG. 7, the CM choke 76 is used in a shunt configuration as in FIG. 6B, except with the addition of two DC biases 74, 75 connected between terminals of the CM choke 76 and ground. In this embodiment, the input signal is introduced to the input balun 64, which then converts the unbalanced input signal into a balanced differential signals. The differential signals are then fed to the balanced amplifier pair 70, 71 and are amplified. The amplified signals are conditioned by the shunt CM choke 76 as described before. The addition of DC biases (such as the DC biases 74, 75) for the balanced amplifier pairs 70, 71 and 72, 73 does not negatively impact the performance of the CM choke 76 as a RF signal conditioner, since RF ground can be achieved using shunt decoupling capacitors, and the DC currents in each winding are of a polarity such that magnetic saturation does not occur. The CM choke 76 can appear to be transparent to the DC (or essentially very low frequency) signal while presenting the optimal inductance for operation of the CM choke 76. As a result, the CM choke 76 can afford parallel and independent functions in the circuit of DC current supply and second harmonic suppression while saving in component counts, cost, and size. The conditioned signals are then fed to the next balanced amplifier stage with balanced amplifier pair 72, 73. The amplified output signals from balanced amplifier pair 72, 73 are further fed into the output balun 65, which combines the out-of-phase signals, effectively shifting one of the input signals by 180 degrees and adding the resulting signals together to produce the final output signal.

Figure 8:
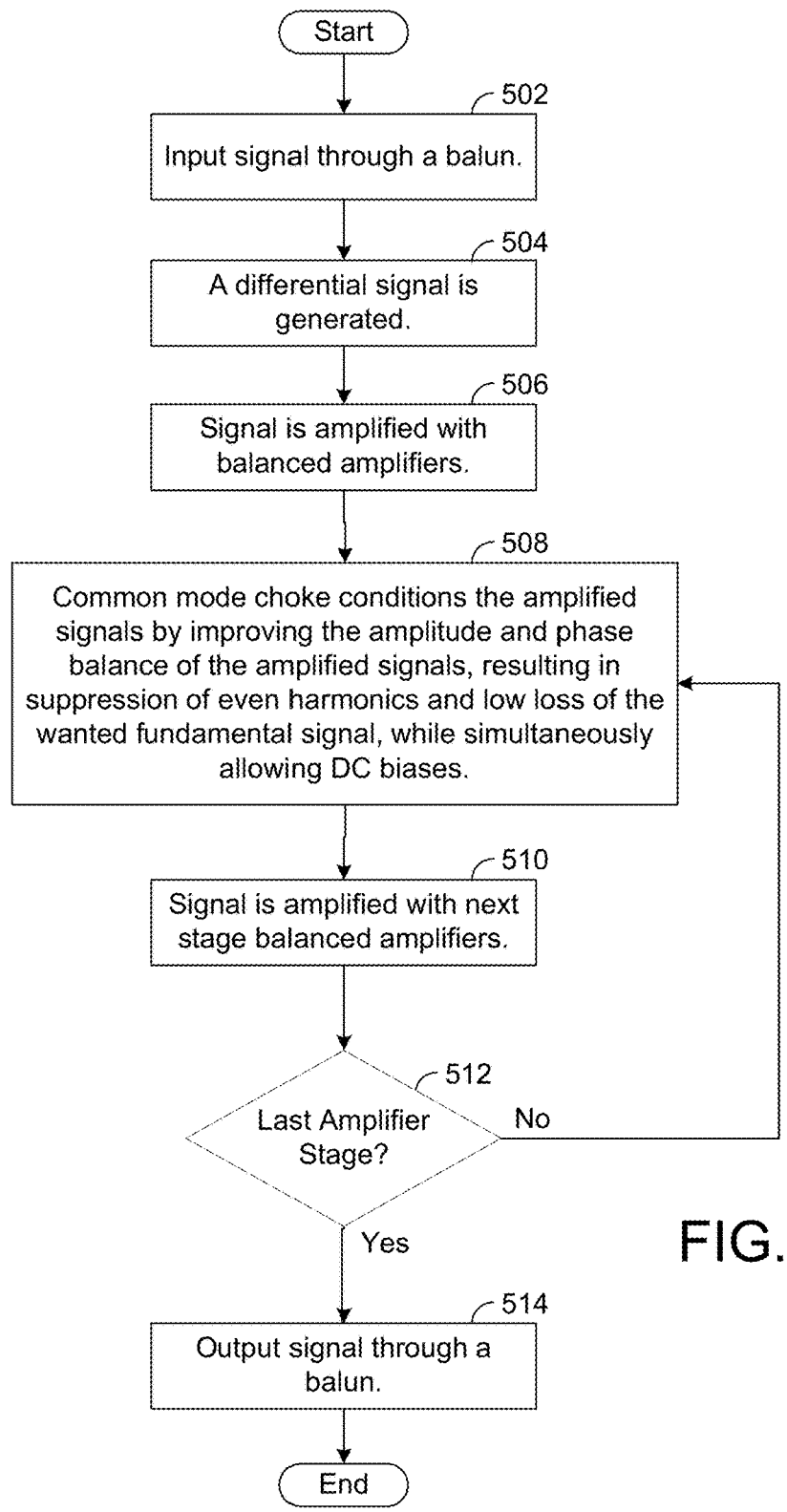
FIG. 8 depicts an exemplary embodiment of a flow chart implementing CM choke technology.

FIG. 8 depicts an exemplary flow chart for operation of the CM choke 31. The process begins with the introduction of an input signal through an input balun (step 502), followed by the input balun converting the unbalanced input signal into a balanced differential signal (step 504). After that, the balanced differential signal is amplified with a pair of matched balanced amplifiers (step 506) forming a first stage of a balanced PPA. Subsequently, the amplified signals, which are non-linearly distorted by the amplifiers, can be conditioned by a CM choke 31, where the amplitude and phase balance of the amplified signals are improved, resulting in suppression of even harmonics and low loss of the wanted fundamental signal, while simultaneously allowing DC biases to be applied to the circuit as needed (step 508). The conditioned signal is then amplified by the next pair of matched balanced amplifiers (step 510) forming a subsequent stage of a balanced PPA. Next, a determination is made as to whether the subsequent amplifier stage is the last amplifier stage (step 512). If the subsequent amplifier stage is the last amplifier stage, the operation proceeds to combine the differential output signals from the last amplifier stage with the output balun (step 514). If the subsequent amplifier stage is not the last amplifier stage (i.e., more amplifier stages are required for reasons such as additional gain or signal conditioning), the amplified signals from the previous amplifier stage can again be conditioned by another CM choke 31 in the same manner as step 508, and the conditioned signal can be further fed into another amplifier stage as in step 510. Steps 508 and 510 can be repeated as many times as needed before going to step 514 to complete the process.

Figure 9:
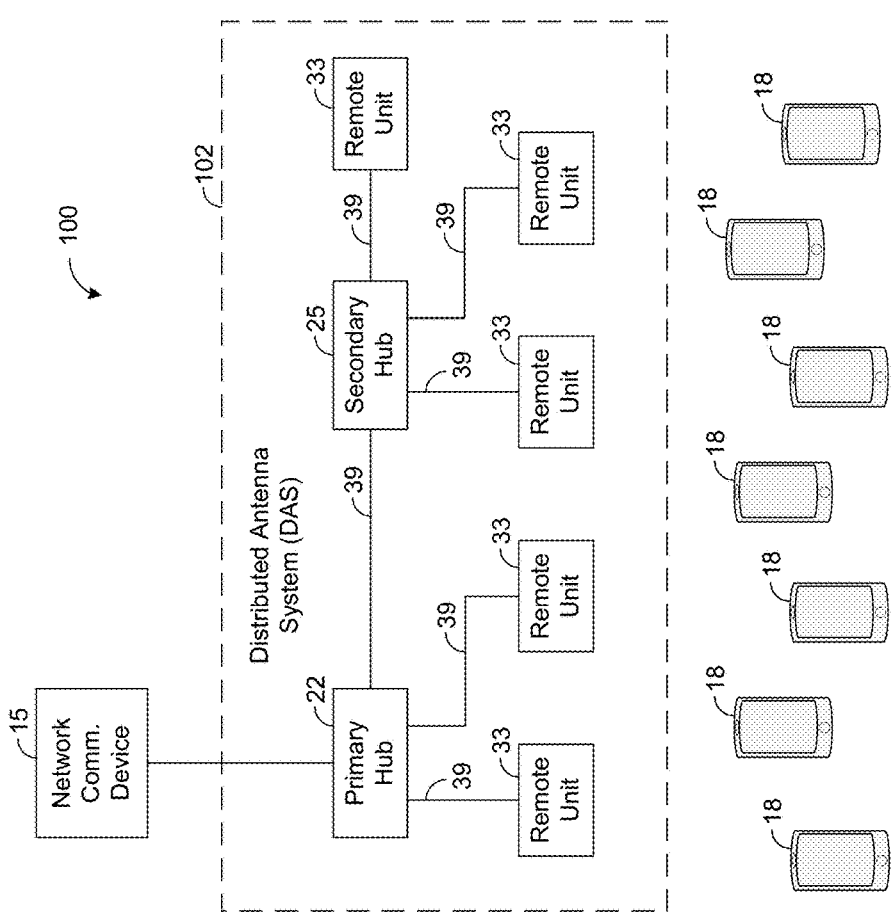
FIG. 9 depicts a block diagram of a communication system in accordance with certain embodiments of the application.
Figure 10:
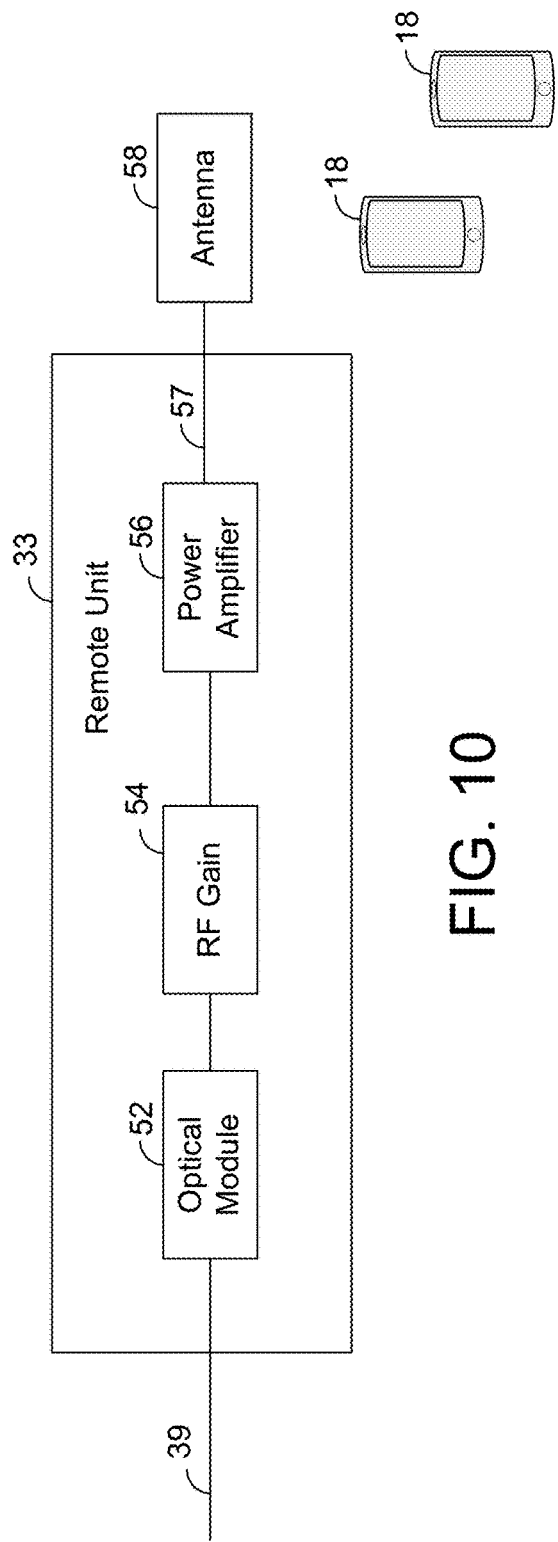
FIG. 10 depicts a block diagram of a remote unit of a distributed antenna system in accordance with certain embodiments of the application.
Figure 11:
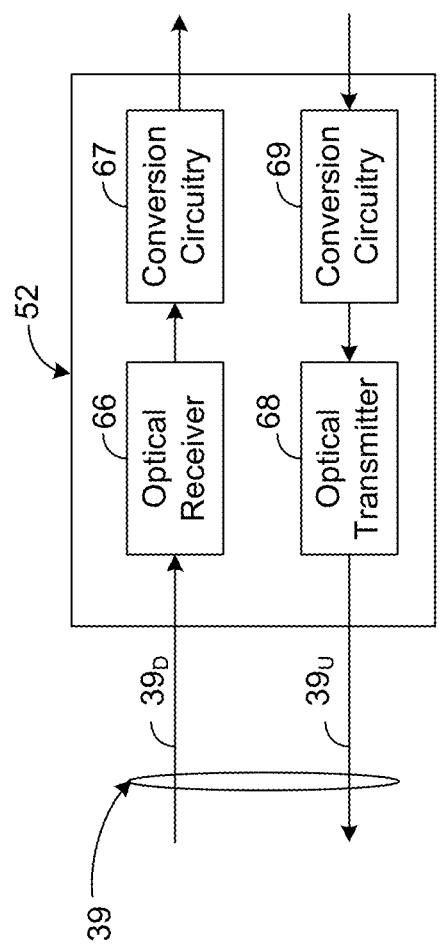
FIG. 11 depicts a block diagram of an optical module in accordance with certain embodiments of the application.

In various embodiments, the disclosed CM choke technology can be implemented in linear communication systems where nonlinear signal distortion or conditioning occurs such as the exemplary embodiments as depicted in FIGS. 9, 10, and 11. FIG. 9 depicts an embodiment of a communication system 100 having a distributed antenna system (DAS) 102 for wirelessly communicating signals between at least one network communication device 15 (e.g., a RF device) and numerous mobile communication devices 18. Such a system may be employed in a variety of applications, for example, where coverage by communication networks (e.g., cellular, WiFi, etc.) is limited or where a high density of communication devices 18 are typically used and employed, such as sporting venues, public squares, casinos, convention centers, hotels, and other similar venues. The exemplary DAS 102 of FIG. 9 has a hub 22, referred to herein as a "primary hub," that may be coupled to one or more network communication devices 15. The network communication device or devices 15 may function as a gateway to one or more existing communications systems, such as the different cellular phone networks of different carriers, the internet, fiber optic networks, etc.

In an embodiment, the DAS 102 may facilitate communications between a number of disparate networks that are accessible from the network communication device(s) 15 and the disparate mobile communication devices 18 that operate on those networks. Although the DAS 102 may operate in a variety of manners (e.g., by providing a plurality of communication paths for different devices to communicate with different networks), in an exemplary embodiment as described herein, the DAS 102 may function as a wideband DAS, that communicates RF signals between the network communication device 15 and the mobile communication devices 18 over a wide range of frequencies that are at least 1 octave apart, and in many embodiments, frequencies that are one, two, or greater orders of magnitude apart may be communicated, for example, in ranges such as 130 MHz to 2.7 GHz, 130 MHz to 3.5 GHz, and 150 MHz to 6 GHz (e.g., to accommodate any such signals in this range including the 5.9 GHz ISM band). In this manner, the DAS 102 may facilitate communications over multiple different communication and network protocols over a single DAS 102, with the underlying RF communication signals being communicated over shared communication mediums without modification. In an embodiment, DAS 102 may provide for end-to-end communications between the network communication device or devices 15 and the mobile communication devices 18, without performing any RF modulation of the disparate RF signals that are communicated over differing networks and via differing protocols. All communications may be routed through DAS 102 without RF modulation, for example, via fiber optic communication links that employ optical signal modulation between RF conversion stages, as described herein. Additional information regarding the operation of a DAS can be found in U.S. Patent Application Publication No. 2012/0319916 A1, published on Dec. 20, 2012, and entitled Communication System, which publication is hereby incorporated by reference in its entirety.

Returning to FIG. 9, the network communication device 15 may be coupled to a primary hub 22 of DAS 102. The primary hub 22 may be coupled to at least one other hub 25, referred to herein as a "secondary hub," and a plurality of remote units 33. Together, the primary hub 22 and secondary hubs 25 may form a star network, with the primary hub 22 functioning as a primary node and the secondary hubs 25 functioning as branch or peripheral nodes. Each remote unit 33 provides for a communication endpoint with mobile devices 18 (e.g., via RF transmissions through an antenna of the remote units 33). Each secondary hub 25 may provide for connections to additional remote units 33 as well as additional secondary hubs 25. For simplicity of illustration, FIG. 9 shows a single secondary hub 25. However, the primary hub 22 may be interfaced with multiple secondary hubs 25, and a secondary hub 25 may be further interfaced with multiple additional secondary hubs 25 to form a DAS 102 of any desired size or scale (e.g., as a two-star distributed antenna system). The secondary hubs 25 may in turn be coupled to additional remote units 33, which permits the DAS 102 to be employed over large physical areas and for scalability to dozens or even hundreds of remote units 33 over unique physical environments.

In some embodiments, the primary hub 22 may be coupled to the secondary hub 25 and the remote units 33 by respective optical fibers 39. In an embodiment, each optical fiber 39 may include a plurality of fiber connections (e.g., two) to provide different physical fiber links for uplink and downlink communications over DAS 102. In other embodiments, connections to remote units 33 by the primary hub 22 or secondary hub 25 may be direct electrical connections, with optical connections only provided between the primary hub 22 and the secondary hub(s) 25. In other embodiments, other types of communication connections may be used. Indeed, it is possible for any component of the DAS 102 to communicate with any other component optically, electrically, or wirelessly. However, the signals that are communicated through the DAS 102 (e.g., the underlying RF communication signal) need to be retained or reconstructed at both ends of the DAS 102 to enable communications with remote devices 18 and network communication device 15. Accordingly, as will be described in more detail hereafter, any of the components of the DAS 102, such as the primary hub 22, secondary hub 25, and remote units 33, may employ RF amplifiers that amplify signals for RF communications. As described herein, these amplifiers may be configured to implement the CM choke 31 to reduce undesired signal characteristics such as nonlinear distortions (e.g., second and higher even order harmonics) and reduce signal loss on the output RF signal, which might otherwise occur during gain stages. In addition, the CM choke 31 can allow DC biases to be applied to the signals while reducing circuit component count, size, and costs.

In the downstream direction, the primary hub 22 may receive electrical signals (e.g., multiple RF signals or other type of signal over a wideband) to be communicated to different ones of mobile communication devices 18 (e.g., to different subscribers on different cellular networks). In an embodiment, the primary hub 22 includes multiple service modules, processors, memory devices, and RF communication devices and switches that facilitate the combination of the incoming RF traffic into common RF data (e.g., to combine and balance the mix of cellular service signals and other RF signals into one wideband composite RF signal). The output RF data is provided to one or more optical modules of the primary hub 22, the optical modules can modulate the RF signals for transmission as an optical signal over optical fibers 39. In an embodiment, the modulation of the RF signals does not change the underlying RF signal, but instead, merely provides an optical carrier signal for the underlying RF signals without conversion into a digital signal. The resulting downstream optical signal is transmitted over the optical fibers 39 (e.g., over a downlink fiber of an optical fiber 39). Although in an embodiment, the same downlink signal may be transmitted over each of the optical fibers 39, in other embodiments, different downlink signals with different RF signals may be routed to different remote units 33 or secondary hubs 25 (e.g., based on knowledge and/or predictions regarding the locations of various mobile communication devices 18 relative to components of the DAS 102).

A remote unit 33 may receive the downlink signal (e.g., the optical signal including an optical carrier and the underlying RF signals) from the primary hub 22 and output the underlying RF content received from the network communication device 15 to the mobile devices 18 via a local antenna of the remote unit 33. In an embodiment, the received optical signal may be converted to the electrical domain, for example, by demodulating the optical carrier to output the underlying RF electrical content. However, while the underlying RF signal may maintain its underlying content (e.g., relative frequency, phase, amplitude, etc.) as a result of optical transmission and conversion, the signal may need to be amplified prior to transmission to the mobile communication devices 18. As described herein, a RF gain stage may amplify the signal for transmission, in a manner that reduces the second order non-linear distortion that RF amplifiers often impart on the amplified signal by implementing the CM choke 31. By reducing this second order non-linear distortion, the CM choke 31 may provide for a transmitted signal from the remote unit 33 that is free of non-compliant spurious emissions created at the sum and difference frequencies of the individual RF carriers. Furthermore, the CM choke 31 can reduce signal loss, allow DC biases, and reduce circuit size, cost, and component count.

Each secondary hub 25 may include suitable processors, memory, hardware, and software to facilitate the distribution of the signals (e.g., optical signals carrying RF content) throughout the DAS 102. In an embodiment, the secondary hub 25 may include a plurality of optical modules that transmit or receive optical signals, with the receiving optical modules converting the incoming optical signal into a RF signal and the transmitting optical modules converting RF signals into the outgoing optical signal. Internal processing of the RF signals by the secondary hub 25 may in some instances require one or more gain stages. In other embodiments, the secondary hub 25 may route optical systems between various locations, without intermediate RF conversion within the secondary hub 25. In some embodiments, a secondary hub 25 may perform some portion of the functionality provided by a remote unit 33, for example, by providing for transmission of an RF signal from antennas coupled directly to secondary hub 25, or performing a conversion to RF signals and providing the electrical RF signal to a remote unit 33.

Note that the system 100 may have components, such as repeaters (not shown) or networks (not shown), through which signals may be communicated to extend the effective communication range between the DAS 102 and the mobile communication devices 18. In addition, if the DAS 102 has additional secondary hubs 25, the signal being communicated downstream may be similarly converted from the optical domain to the electrical domain at each secondary hub 25 for wireless transmission of the signal by remote units 33 coupled to the respective secondary hub 25.

In the upstream direction, the mobile communication devices 18 may wirelessly transmit an electrical signal (e.g., a RF signal) to be received by the communication device 15. Such signals may be received by any of the remote units 33 based on the location of the mobile communication devices 18 relative to the remote units 33. In an embodiment, in which the remote units 33 communicate with the primary hub 22 and/or secondary hub(s) 25 via optical communications, a RF signal received by a remote unit 33 may be converted to the optical domain and transmitted to the primary hub 22 or the secondary hub 25 via an uplink fiber of optical fibers 39. The optical fibers 39 may then provide the optical signal to the primary hub 22 (if the previous signal was sent to a secondary hub 25) via an uplink fiber of optical fiber 39. The primary hub 22 may then convert the optical signal to a RF electrical signal for transmission of the electrical signal to the network communication device 15, which may require one or more RF amplification stages. Here the signal quality and circuit of the RF amplification stage can also be improved with the CM choke 31. The network communication device 15 may then provide the output RF signals to the target communication networks (e.g., by distinguishing and selectively distributing via different bands and communication protocols).

FIG. 10 depicts an embodiment of a remote unit 33 in accordance with some embodiments of the present disclosure. Although a remote unit 33 may send and receive signals to primary hub 22 and/or secondary hub(s) 25 or other devices via a variety of transmission mediums (e.g., optical, electrical, wireless, etc.), the remote unit 33 may communicate with primary hub 22 and/or secondary hub(s) 25 via optical fibers in an embodiment. Although remote unit 33 may include different hardware in order to communicate via different transmission mediums, and utilize different hardware and software for each transmission medium, the remote unit 33 may communicate via optical fibers and may include an optical module 52, a RF gain stage 54, a power gain stage (or power amplifier) 56, and an electrical communication path 57 that may be coupled to an antenna 58 in an exemplary embodiment.

Optical module 52 may be coupled to the optical fiber 39. In an embodiment, optical module 52 may be coupled to separate downlink and uplink fibers of the optical fiber 39, such that optical module 52 (or, in some embodiments, multiple optical modules) provides parallel processing of downlink traffic (e.g., requiring optical to electrical conversion from the hub to the antenna) and uplink traffic (e.g., requiring electrical to optical conversion to the hub from the antenna). For the downlink signal, the optical module 52 may detect the envelope of an optical carrier signal and output the wideband of RF signals to a RF gain stage 54 without modulation of the underlying RF signals. For the uplink signal, the RF signals may be provided to the optical module 52 from the RF gain stage 54 as a wideband of RF signals, and the optical module 52 may apply a conversion to the optical domain by applying intensity modulation to an optical carrier signal, providing the resulting optical signal to the uplink fiber of optical fiber 39.

RF gain stage 54 may apply a RF gain to the RF signals that are exchanged between the optical modules 52 and the antennas 58 (e.g., via power amplifier 56 and electrical communication path 57). In an embodiment as described in more detail herein, the RF gain stage 54 may employ techniques to apply a significant (e.g., 5X, 10X, 20X, 50X) gain to the RF signal received from either the optical module 52 or antenna 58, while avoiding non-linear distortions (e.g., second order non-linear distortions) from being applied to the RF signals by the amplifiers of the gain stage by implementing the CM choke 31 as disclosed herein to improve the desired signals, suppress undesired harmonics, to apply DC biases, and to reduce size, cost, and component counts of the system. Moreover, while the RF gain stage 54 is described herein as being employed at the remote unit 33, it will be understood that the RF gain stage 54 as described herein may be employed at any suitable stage of a system (e.g., electrical, optical, wireless, etc.) at which RF signals need to be amplified, for example, at each of hub 22 and secondary hub(s) 25, wherein conversion between optical and electrical signals occurs.

Power amplifier 56, electrical communication path 57 and antenna 58 may provide for the wideband wireless communication interface with the mobile communication devices 18. Power amplifier 56 may accommodate the entire wideband as described herein, providing amplification of transmitted and received signals to and from the antenna 58 (e.g., transmitted and received via a coaxial cable or other similar electrical communication path 57) from a variety of carriers and utilizing a number of different communication protocols, as described herein. Similarly, the CM choke 31 may be applied to the power amplifier 56 to improve desired signals, suppress undesired harmonics, to apply DC biases, and to reduce size, cost, and component counts of the system. In this manner, multiple different mobile communication devices 18 within the physical range of the power amplifier 56 and antenna 58 may transmit and receive communications over their communication networks via DAS 102.

FIG. 11 depicts an embodiment of an optical module 52 (e.g., of a remote unit 33, primary hub 22, or secondary hub 25). The optical module 52 of FIG. 11 has an optical receiver 66 that is coupled to a downlink fiber of an optical fiber 39, such as downlink fiber $39_D$ of the optical fiber 39 that can also be coupled to the primary hub 22 or secondary hub 25. The optical receiver 66 is configured to receive an optical signal carried by the fiber 39 and convert the received signal from the optical domain to the electrical domain. As an example, the optical receiver 66 may include an avalanche photodiode (APD) and associated circuitry for biasing the APD so that the APD has a desired sensitivity for appropriately converting the optical signal to an electrical signal depending on the expected characteristics, such as received signal strength, of the optical signal.

The electrical signal that is output by the optical receiver 66 may be provided to conversion circuitry 67. In an embodiment, conversion circuitry 67 may remove signal content that was added to the underlying RF signal for optical transmission, such as an optical carrier signal. The resulting RF signal may be output for eventual transmission for an antenna 58 (e.g., to a gain stage 54 that amplifies the received electrical signal received via the optical receiver 66, thereby providing a gain (G) to such signal). The gain stage 54 has circuitry (e.g., one or more RF power amplifiers) for amplifying an electrical signal, and the gain stage 54 processes the received electrical signal in a manner that eliminates second order harmonic distortion without requiring complex, lossy, and/or bulky circuitry such as additional baluns and/or elements for applying DC bias to the gain circuitry. In one embodiment, the gain stage 54 can incorporate the CM choke 31 (which can be arranged in the multi-stage, single stage, shunt, series, or DC bias configurations as detailed before) to improve the desired signal, suppress even harmonics, and to allow DC biases to be implemented with fewer components, cost, and size.

The optical module 52 of FIG. 11 can also have an optical transmitter 68 that is coupled to an uplink fiber of an optical fiber 39, such as uplink fiber $39_U$ of the optical fiber 39. The optical transmitter 68 is configured to receive an electrical signal from the conversion circuitry 69 and convert this signal from the electrical domain to the optical domain. In an embodiment, conversion circuitry 69 may add signal content to the underlying RF signal for optical transmission, such as an optical carrier signal. The resulting signal from the conversion circuitry 69 can be output to the optical transmitter 68 for eventual transmission to the primary hub 22 or secondary hub 25 via optical fiber 39.

The RF signal received by the antenna 58 may be amplified with the gain stage 54 before being received by the conversion circuitry 69. The gain stage 54 has circuitry (e.g., one or more RF power amplifiers) for amplifying an electrical signal, and the gain stage 54 processes the received electrical signal in a manner that eliminates second order harmonic distortion without requiring complex, lossy, and/or bulky circuitry such as additional baluns and/or elements for applying DC bias to the gain circuitry. In one embodiment, the gain stage 54 can incorporate the CM choke 31 (which can be arranged in the multi-stage, single stage, shunt, series, or DC bias configurations as detailed before) to improve the desired signal, suppress even harmonics, and to allow DC biases to be implemented with fewer components, cost, and size.

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the scope of the following claims.

As a further example, variations of apparatus or process parameters (e.g., dimensions, configurations, components, process step order, etc.) may be made to further optimize the provided structures, devices and methods, as shown and described herein. The structures and devices, as well as the associated methods, described herein have many applications. Therefore, the disclosed subject matter should not be limited to any single embodiment described herein, but rather should be construed in breadth and scope in accordance with the appended claims.

What is claimed is:

1. A balanced amplifier for a component of a communication system, comprising:
   a first amplifier stage having an input connection to receive an unbalanced input signal, the first amplifier stage comprising a first pair of amplifiers having substantially identical amplitude and phase responses;

a second amplifier stage having an output connection to provide an unbalanced output signal, the second amplifier stage comprising a second pair of the amplifiers having substantially identical amplitude and phase responses; and a common mode choke coupled to the first amplifier stage and the second amplifier stage, the common mode choke configured to receive amplified signals from the first pair of the amplifiers, generate conditioned signals based on the received amplified signals, and provide the conditioned signals to the second pair of the amplifiers, the common mode choke configured to generate the conditioned signals by suppressing common mode signals in the received amplified signals.

2. The balanced amplifier of claim 1, wherein the common mode choke is coupled to the first pair of the amplifiers and the second pair of the amplifiers in a series mode connection.

3. The balanced amplifier of claim 1, wherein the common mode choke is coupled to the first pair of the amplifiers and the second pair of the amplifiers in a shunt mode connection.

4. The balanced amplifier of claim 3, wherein the common mode choke is configured to supply a DC (direct current) bias to one or more of the first pair of the amplifiers and the second pair of the amplifiers.

5. The balanced amplifier of claim 1, wherein:
the first amplifier stage comprises a first transformer, the first transformer configured to receive the unbalanced input signal and to provide a first balanced signal to the first pair of the amplifiers; and
the second amplifier stage comprises a second transformer, the second transformer configured to receive a second balanced signal from the second pair of the amplifiers and to provide the unbalanced output signal.

6. The balanced amplifier of claim 5, wherein the first balanced signal comprises a first differential mode signal and a second differential mode signal 180 degrees out of phase with the first differential mode signal, wherein the first transformer is configured to provide the first differential mode signal to an amplifier of the first pair of the amplifiers and to provide the second differential mode signal to a remaining amplifier of the first pair of the amplifiers.

7. The balanced amplifier of claim 5, wherein the second balanced signal comprises a third differential mode signal and a fourth differential mode signal 180 degrees out of phase with the third differential mode signal, wherein the second transformer is configured to receive the third differential mode signal from an amplifier of the second pair of the amplifiers and to receive the fourth differential mode signal from a remaining amplifier of the second pair of the amplifiers.

8. The balanced amplifier of claim 1, wherein the common mode choke comprises a pair of inductively coupled windings.

9. The balanced amplifier of claim 1, wherein the common mode choke is a first common mode choke, the amplified signals are first amplified signals, the conditioned signals are first conditioned signals and the balanced amplifier further comprises:
at least one third amplifier stage coupled to the first common mode choke to receive the first conditioned signals from the first common mode choke, each third amplifier stage comprising a third pair of amplifiers having substantially identical amplitude and phase responses; and
at least one second common mode choke coupled to the at least one third amplifier stage, the at least one second common mode choke configured to receive second amplified signals from the at least one third pair of the amplifiers, generate second conditioned signals based on the received second amplified signals, and provide the second conditioned signals to the second pair of the amplifiers, the second common mode choke configured to generate the second conditioned signals by suppressing common mode signals in the received second amplified signals from the at least one third pair of the amplifiers.

10. A method for amplifying a communication signal, the method comprising:
receiving an unbalanced input signal at an input to a first transformer;
converting, with the first transformer, the unbalanced input signal to a pair of differential mode signals, wherein the pair of the differential mode signals are 180 degrees out-of-phase;
amplifying the pair of the differential mode signals with a first pair of balanced amplifiers to generate a first pair of amplified signals, wherein the first pair of the balanced amplifiers having substantially identical amplitude and phase responses;
conditioning the first pair of the amplified signals with a common mode choke to generate a pair of conditioned signals, wherein common mode signals in the first pair of the amplified signals are suppressed by the common mode choke when generating the pair of the conditioned signals;
amplifying the pair of the conditioned signals with a second pair of the balanced amplifiers to generate a second pair of the amplified signals, wherein the second pair of the balanced amplifiers having substantially identical amplitude and phase responses; and
converting, with a second transformer, the second pair of the amplified signals to an unbalanced output signal; and
providing the unbalanced output signal at an output of the second transformer.

11. The method of claim 10, further comprising supplying a DC (direct current) bias to one or more of the first pair of the balanced amplifiers and the second pair of the balanced amplifiers with the common mode choke.

12. The method of claim 10, further comprising:
amplifying the pair of the conditioned signals with at least one third pair of balanced amplifiers to generate a third pair of amplified signals;
conditioning the third pair of the amplified signals with a second common mode choke to generate a second pair of conditioned signals, wherein common mode signals in the third pair of the amplified signals are suppressed by the second common mode choke when generating the second pair of the conditioned signals; and
wherein the amplifying the pair of the conditioned signals includes amplifying the second pair of the conditioned signals.

13. The method of claim 12, further comprising repeating the amplifying the pair of the conditioned signals and the conditioning the third pair of the amplified signals for each additional third pair of the balanced amplifiers of the at least one third pair of the balanced amplifiers.

14. The method of claim 10, further comprising connecting the common mode choke between the first pair of the amplifiers and the second pair of the amplifiers with a series connection.

15. The method of claim 14, wherein the conditioning the first pair of the amplified signals includes presenting a high impedance path to the common mode signals as a result of additive magnetic fields and presenting a low impedance path to differential mode signals as a result of cancelling magnetic fields.

16. The method of claim 10, further comprising connecting the common mode choke between the first pair of the amplifiers and the second pair of the amplifiers with a shunt connection.

17. The method of claim 16, wherein the conditioning the first pair of the amplified signals includes presenting a low impedance path to ground for the common mode signals as a result of cancelling magnetic fields and presenting a high impedance path to ground for differential mode signals as a result of additive magnetic fields.

18. A distributed antenna system (DAS) for a communication system, comprising
   a hub having a terminal, the terminal configured to exchange information with a network communication device when the network communication device is coupled to the terminal;
   a plurality of remote units coupled to the hub, the plurality of remote units configured to exchange information with a plurality of mobile communication devices when the mobile communication devices are coupled to the plurality of remote units; and
   a balanced amplifier incorporated in at least one of the hub or at least one remote unit of the plurality of remote units, the balanced amplifier comprising:
      at least one amplifier stage having an input connection to receive an input signal and an output connection to provide an output signal, each amplifier stage of the at least one amplifier stage comprising a pair of amplifiers; and
      a choke device coupled to the pair of the amplifiers of the at least one amplifier stage, the choke device configured to receive amplified signals from the pair of the amplifiers, generate conditioned signals based on the amplified signals from the pair of the amplifiers, and output the conditioned signals, the choke device configured to generate the conditioned signals by suppressing even harmonics in the amplified signals from the pair of the amplifiers.

19. The DAS of claim 18, wherein the remote unit comprises an optical module configured to provide conversions between optical signals and electrical signals, a gain stage coupled to the optical module, a power amplifier coupled to the gain stage and an antenna coupled to the power amplifier, wherein the balanced amplifier is incorporated within at least one of the gain stage or the power amplifier.

20. The DAS of claim 18, wherein the choke device comprises a common mode choke.

21. The DAS of claim 20, wherein the common mode choke is coupled to the at least one amplifier stage with one of a series connection or a shunt connection.

22. The DAS of claim 21, wherein the common mode choke is coupled to the at least one amplifier stage with a shunt connection and the common mode choke is configured to supply a DC bias to the pair of the amplifiers.

23. The DAS of claim 18, wherein the pair of the amplifiers comprises a first amplifier and a second amplifier, the first amplifier configured to receive a first differential signal and apply a first predetermined gain to the first differential signal, the second amplifier configured to receive a second differential signal and apply a second predetermined gain to the second differential signal, wherein the second differential signal is 180 degrees out-of-phase from the first differential signal and the second predetermined gain is substantially equal to the first predetermined gain.

24. The DAS of claim 18, wherein the choke device comprises a differential mode choke.

25. The DAS of claim 18, wherein the balanced amplifier comprises a push-pull amplifier.

* * * * *